United States Patent
Mehr et al.

(10) Patent No.: US 8,482,347 B2
(45) Date of Patent: Jul. 9, 2013

(54) AMPLIFIER WITH REDUCED ON/OFF TRANSIENT AND MULTI-POINT OFFSET COMPENSATION

(75) Inventors: Iuri Mehr, Irvine, CA (US); Sherif Galal, Irvine, CA (US); Todd L. Brooks, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/930,487

(22) Filed: Jan. 7, 2011

(65) Prior Publication Data
US 2012/0146719 A1    Jun. 14, 2012

Related U.S. Application Data

(60) Provisional application No. 61/459,526, filed on Dec. 13, 2010.

(51) Int. Cl.
*H03F 1/14* (2006.01)
(52) U.S. Cl.
USPC ............................................................ 330/51

(58) Field of Classification Search
USPC ........................................... 330/51; 381/94.5
See application file for complete search history.

(56) References Cited

U.S. PATENT DOCUMENTS

| | | | |
|---|---|---|---|
| 5,909,643 A * | 6/1999 | Aihara | 455/127.3 |
| 7,382,186 B2 * | 6/2008 | Apel et al. | 330/129 |
| 7,915,953 B2 * | 3/2011 | Ryat | 330/51 |
| 2008/0056513 A1 * | 3/2008 | Rashid | 381/94.5 |

* cited by examiner

*Primary Examiner* — Steven J Mottola
(74) *Attorney, Agent, or Firm* — Farjami & Farjami LLP

(57) ABSTRACT

Disclosed is an amplifier designed to substantially reduce an ON/OFF transient. The amplifier comprises a drive block that includes a pre-driver and an output stage. The amplifier also comprises a bypass circuit that is coupled to an output of the pre-driver. The bypass circuit of the amplifier is selectively activated to reduce the ON/OFF transient. The bypass circuit may comprise an auxiliary output stage that can be coupled to provide selective activation. The amplifier may also be configured to provide multi-point offset compensation. Also disclosed is a related method. The amplifier and the related method may be incorporated into an audio amplifier used in a cellular telephone or other mobile audio device.

20 Claims, 4 Drawing Sheets

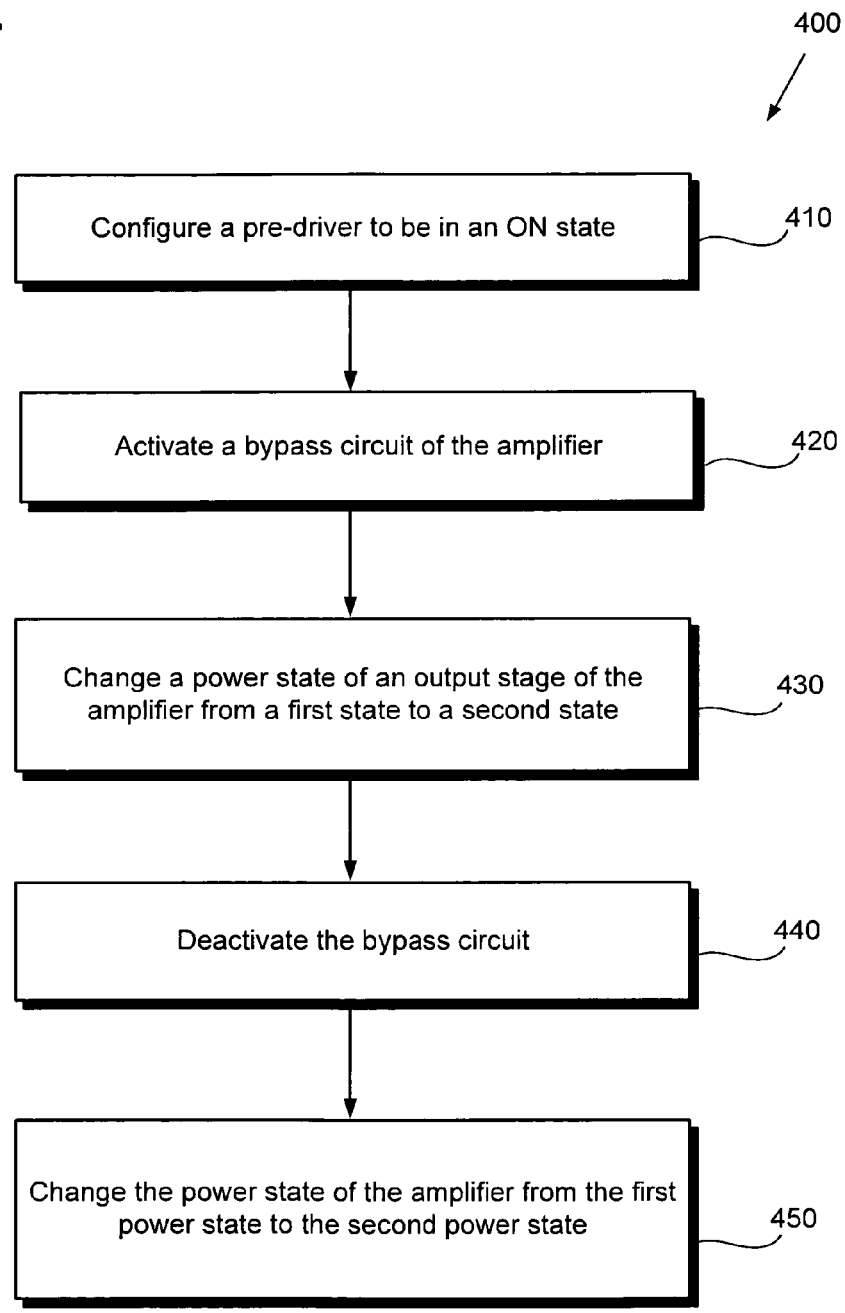

AMPLIFIER WITH REDUCED ON/OFF TRANSIENT AND MULTI-POINT OFFSET COMPENSATION

RELATED APPLICATIONS

The present application claims the benefit of and priority to a pending U.S. Provisional Application Ser. No. 61/459,526 titled "Amplifier with Reduced On/Off Transient and Multi-Point Offset Compensation", filed on Dec. 13, 2010, which is hereby incorporated fully by reference into the present application.

BACKGROUND OF THE INVENTION

1. Field of the Invention

The present invention is generally in the field of electronic circuits and systems. More specifically, the present invention is in the field of amplifier circuitry.

2. Background Art

Audio amplifiers often form an integral part of mobile devices such as cellular telephones. For example, an audio amplifier may boost a low amplitude input signal into an output signal that drives a cellular telephone headset or other load. However, audio amplifiers face at least two problems when used in mobile devices.

First, conventional audio amplifiers are often unable to coherently address an ON/OFF transient, known as a pop/click, audio interference that occurs when a mobile device is powered ON or OFF. Conventional audio amplifiers that use large passive components to limit transient noises are often expensive or difficult to integrate with driver circuitry. Similarly, conventional audio amplifiers that shift an ON/OFF transient to an inaudible frequency using a ramp signal generator are not easily compatible with ground referenced headset drivers. Largely, conventional audio amplifiers have been unable to cost-effectively reduce the ON/OFF transients that often degrade the performance of mobile devices.

Second, conventional audio amplifiers are typically unable to cost-effectively couple the driver circuitry that resides on a driver chip to the communications circuitry that is integrated into a distinct chip, such as a transceiver baseband chip. Unfortunately, conventional audio amplifiers that utilize alternating current (AC) coupling capacitors to provide a direct current (DC) offset may add cost and increase printed circuit board space. Conventional audio amplifiers using AC coupling capacitors may also distort the frequency response and other operating parameters of a mobile device.

Accordingly, there is a need to overcome the drawbacks and deficiencies in the art by providing an amplifier with reduced ON/OFF transient and offset compensation, and which is suitable for implementation in a mobile communications device. Furthermore, it is desirable that the amplifier can be implemented to include variable amplifier gain and multi-point offset compensation.

SUMMARY OF THE INVENTION

The present application is directed to an amplifier with reduced ON/OFF transient and multi-point offset compensation, substantially as shown in and/or described in connection with at least one of the figures, as set forth more completely in the claims.

BRIEF DESCRIPTION OF THE DRAWINGS

FIG. 4 is a flowchart presenting a method for substantially reducing an ON/OFF transient of an amplifier, according to one embodiment of the present invention.

DETAILED DESCRIPTION OF THE INVENTION

Figure 1:
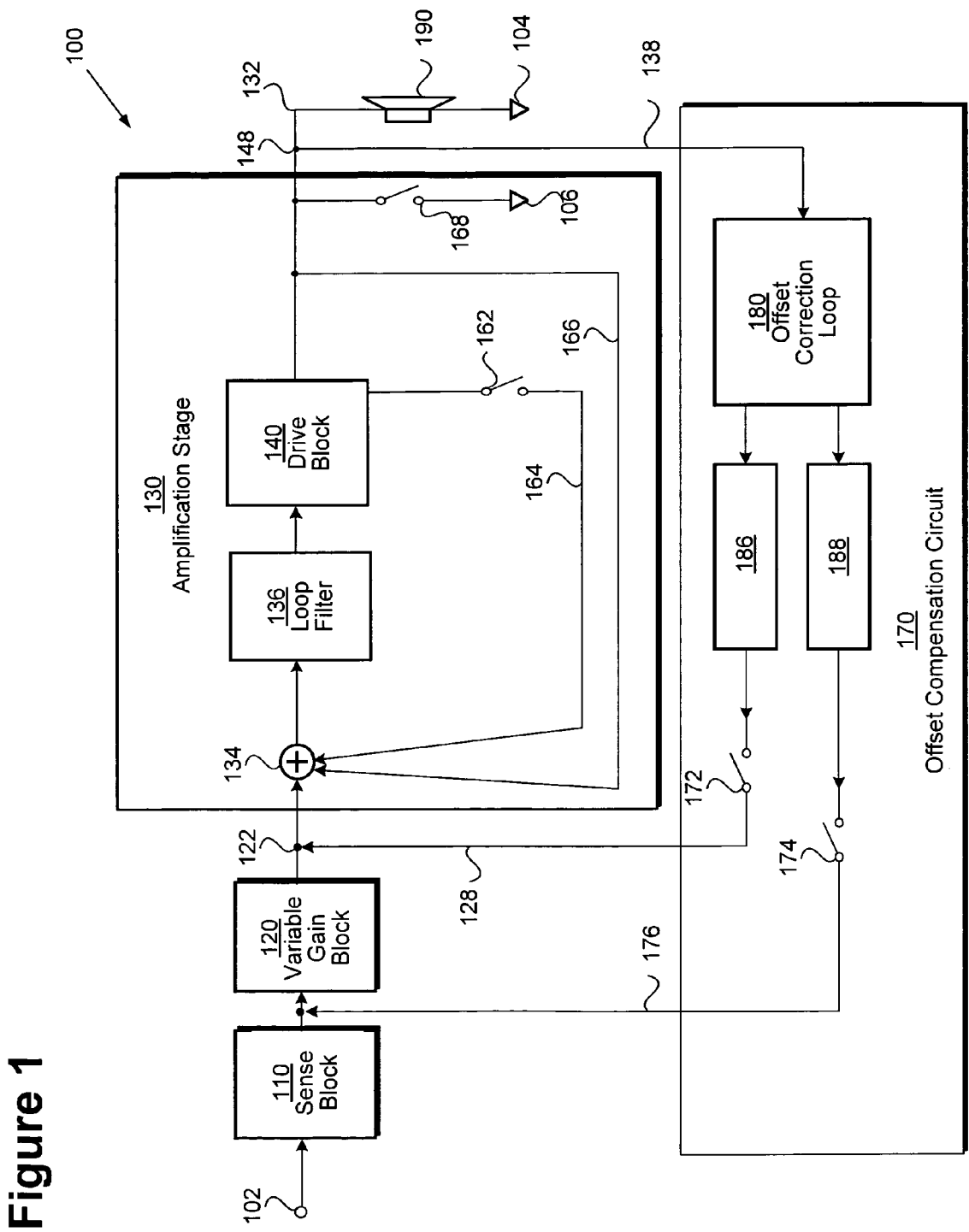
FIG. 1 shows a block diagram of an exemplary amplifier, according to one embodiment of the present invention.

The present invention is directed to an amplifier with reduced ON/OFF transient and multi-point offset compensation. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals. Moreover, the drawings and illustrations in the present application are generally not to scale, and are not intended to correspond to actual relative dimensions.

Conventional audio amplifiers like conventional Class A and conventional Class AB audio amplifiers have faced at least two related problems when used in mobile devices such as cellular telephones. For instance, conventional audio amplifiers are typically prone to an ON/OFF transient that comprises a pop/click audio interference corresponding to a transition of the amplifier from a first power state to a second power state. For example, an ON/OFF transient can occur when a mobile device is powered ON or OFF, and can disturb a listener or can degrade sound quality. Unfortunately, the large passive components or switches used to limit ON/OFF transients are often expensive or difficult to integrate with conventional audio amplifier driver circuitry. Also, conventional audio amplifiers that shift an ON/OFF transient to an inaudible frequency using a ramp signal generator are often incompatible with ground referenced headset drivers, which hold an amplifier output close to a ground reference value during power ON and power OFF sequences.

Moreover, conventional audio amplifiers are frequently unable to cost effectively couple driver circuitry to communications circuitry, which resides on a distinct chip such as a transceiver baseband chip, and which possesses a bias voltage offset from the driver circuitry. Conventional amplifiers using alternating current (AC) coupling capacitors to provide a direct current (DC) voltage offset disadvantageously increase cost, consume large amounts of printed circuit board area, and may distort the frequency response and other operating parameters of a mobile device.

In view of these and other problems, FIG. 1 shows amplifier 100 according to one embodiment of the present invention. Amplifier 100 may be changed from a first power state, such as an OFF state or an ON state, to a second, opposite power state, such as an ON state or an OFF state, with a reduced ON/OFF transient. Amplifier 100 can be directly coupled to communication circuitry on a distinct chip such as a transceiver baseband chip.

FIG. 1 further shows amplifier 100 receiving processed signal 102 and producing output signal 132 at output 148. Processed signal 102 may come from communications circuitry (not shown in FIG. 1) on a transceiver baseband chip (also not shown in FIG. 1). Load 190 may be a ground-referenced load, such as a ground referenced headset driver. Load 190 may be connected to ground reference 104 and driven by output signal 132. Amplifier 100 may be a Class A or a Class AB audio amplifier and may be integrated into a cellular phone, for example.

Amplifier 100 may comprise amplification stage 130 and offset compensation circuit 170. Offset compensation return path 138 may couple output 148 from amplification stage 130 to offset compensation circuit 170. First offset compensation feedback path 128 may couple offset compensation circuit 170 to the input of amplification stage 130 and a first end of variable gain block 120. Similarly, second offset compensation feedback path 176 may couple offset compensation circuit 170, an end of sense block 110, and a second end of variable gain block 120. Amplification stage input 122 may connect variable gain block 120 and amplification stage 130. Processed signal 102 may be directly coupled to the other end of sense block 110.

Internally, amplification stage 130 may comprise summer 134, loop filter 136, drive block 140, bypass feedback switch 162, ground connection switch 168, and ground reference 106. Bypass feedback switch 162 may selectively couple drive block 140 to summer 134 through bypass feedback branch 164. Control feedback loop 166 may connect output 148 to summer 134. Additionally, ground connection switch 168 may selectively couple output 148 to ground reference 106.

It is noted that although in the embodiment shown by FIG. 1, bypass feedback branch 164 is represented as a simple switchable connection coupling drive block 140 and summer 134, in other embodiments, alternative implementations are contemplated as well. For example, in other embodiments, bypass feedback branch 164 can couple drive block 140 to any point from input 102 to the input to drive block 140. In addition, in some embodiments, bypass feedback branch may omit switch 162. Moreover, in some embodiments, bypass feedback branch 164 may comprise a signal processing block, and may include a loop filter or gain stage, for example.

Offset compensation circuit 170 may comprise offset correction loop 180, digital-to-analog converter (DAC) block 186, and DAC block 188. First switching group 172 may selectively couple DAC block 186 to the input of amplification stage 130 and the first end of variable gain block 120. Second switching group 174 may selectively couple DAC block 188 to the second end of variable gain block 120 and to sense block 110.

Figure 2:
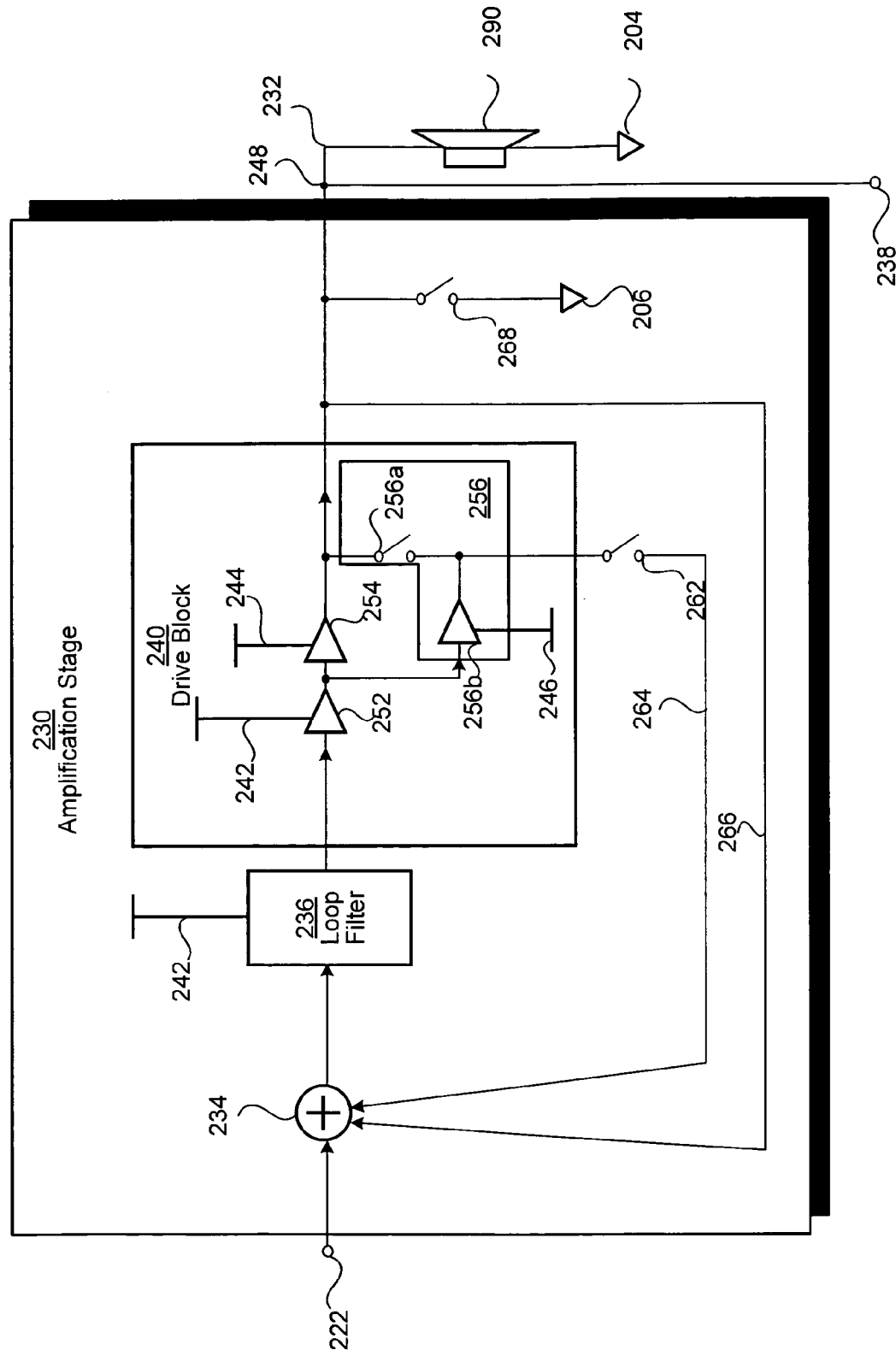
FIG. 2 illustrates a block diagram of an amplification stage of an amplifier, according to one embodiment of the present invention.

Turning to FIG. 2, FIG. 2 illustrates amplification stage 230, which could correspond to amplification stage 130 in FIG. 1, at a greater level of detail. As shown in FIG. 2, amplification stage 230 may receive amplification stage input 222 and may produce output signal 232 at output 248 to drive load 290.

In one embodiment of the present invention, amplification stage 230 may be connected to an offset compensation circuit such as offset compensation circuit 170 in FIG. 1 through offset compensation return path 238. In another embodiment of the present invention, amplification stage 230 in FIG. 2 may be implemented without an offset compensation circuit.

As shown in FIG. 2, amplification stage 230 may comprise summer 234, loop filter 236, drive block 240, bypass feedback switch 262, ground connection switch 268, and ground reference 206. Bypass feedback switch 262 may couple drive block 240 to summer 234 through bypass feedback branch 264. Control feedback loop 266 may connect output 248 to summer 234. Ground connection switch 268 may selectively couple output 248 to ground reference 206.

Drive block 240 in FIG. 2 may comprise pre-driver 252 and output stage 254. Output stage 254 may comprise one or more transistors configured to provide Class A or Class AB amplification. Drive block 240 may also comprise bypass circuit 256, shown coupled between an output of pre-driver 252 and output 248. Bypass circuit 256 may also comprise auxiliary output stage 256b and auxiliary output switch 256a. Auxiliary output switch 256a may selectively couple bypass circuit 256 to output 248.

It is noted that although the embodiment of FIG. 2 shows bypass circuit 256 as being configured to switchably couple an output of pre-driver 252 to either or both of output 248 and bypass feedback branch 264, that representation is provided simply as an example. In some embodiments, bypass circuit 256 may be implemented to selectably couple an output of pre-driver 252 to feedback branch 264 but not to output 248, while in other embodiments, bypass circuit 256 may be implemented to selectably couple the output of pre-driver 252 to output 248 but not to feedback branch 264, e.g., feedback branch 264 may be omitted from some of those latter embodiments. However, in some embodiments, as shown by FIG. 2, bypass circuit 256 may be implemented to selectably couple the output of pre-driver 252 to either of feedback branch 264 and output 248.

Amplification stage 230 may comprise main power source 242, output power source 244, and auxiliary power source 246. Main power source 242 may power both loop filter 236 and pre-driver 252. Output power source 244 may power output stage 254. Additionally, auxiliary power source 246 may power auxiliary output stage 256b. Power sources 242, 244, and 246 may be powered ON or OFF independently from one another.

Figure 3:
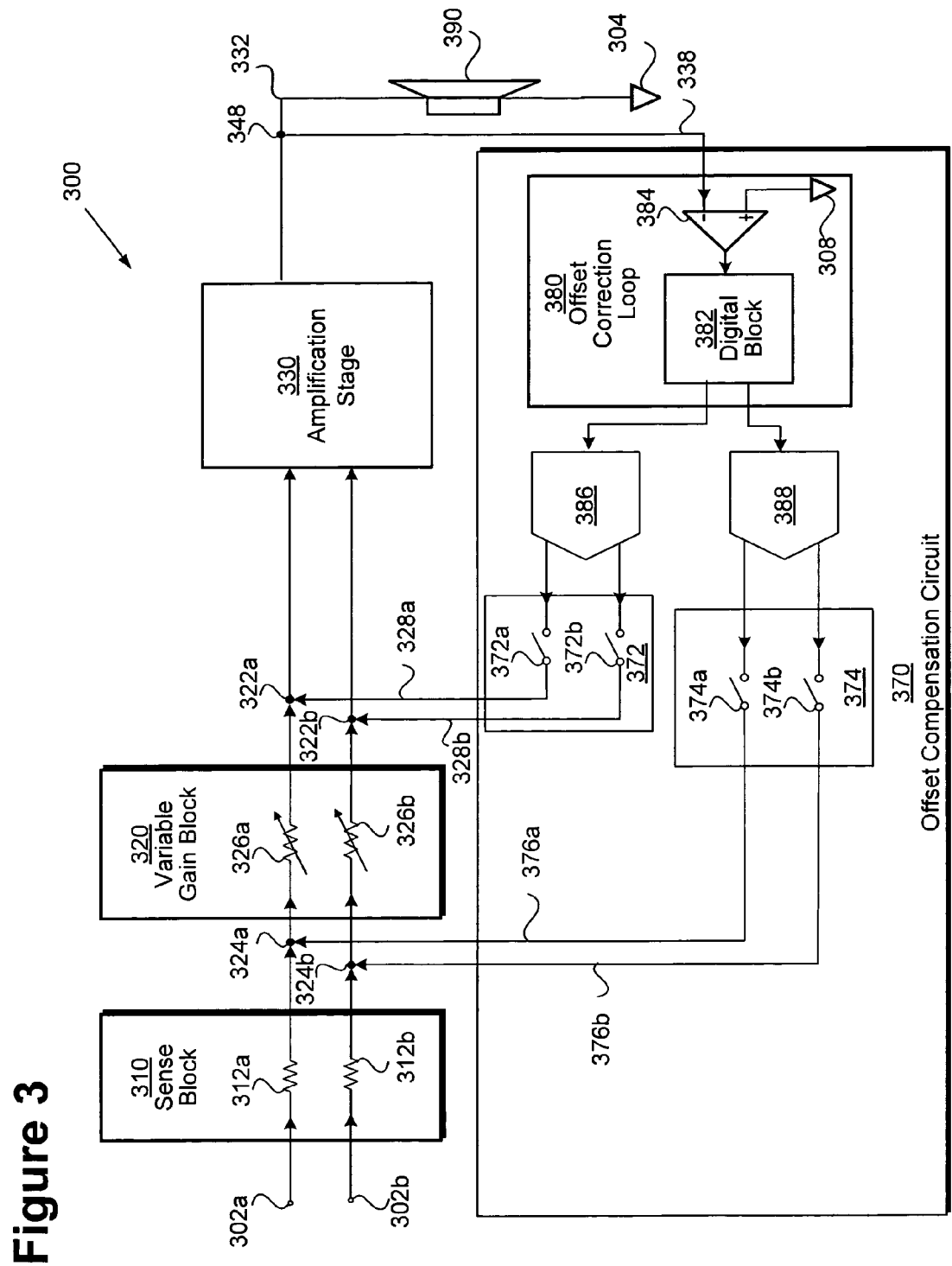
FIG. 3 shows an amplifier, illustrating offset compensation circuitry of an embodiment of the present invention.

Offset compensation circuitry of the present invention will be further discussed in the context of FIG. 3, showing amplifier 300. Amplifier 300 is pictured in a differential configuration but embodiments of the present invention may employ other configurations without departing from the scope of the present invention. For example, amplifier 300 may correspond to amplifier 100 in FIG. 1. As shown in FIG. 3, amplifier 300 may receive a differential processed signal comprising positive processed signal 302a and negative processed signal 302b. Amplifier 300 may drive load 390 with output signal 332 at output 348.

Amplifier 300 may comprise amplification stage 330 and offset compensation circuit 370. As shown, offset compensation return path 338 may couple output 348 to offset compensation circuit 370. First offset compensation feedback lines 328a and 328b may couple offset compensation circuit 370 to the input of amplification stage 330 and a first end of variable gain circuit 320. Similarly, second offset compensation lines 376a and 376b may couple offset compensation circuit 370 to an end of sense block 310 and a second end of variable gain block 320. FIG. 3 shows respective positive and negative processed signals 302a and 302b directly coupled to the other end of sense block 310. It is noted that amplifier 300 including sense block 310, variable gain block 320, amplification stage 330, and offset compensation circuit 370 corresponds to amplifier 100 including sense block 110, variable gain block 120, amplification stage 130, and offset compensation circuit 170, in FIG. 1.

Internally, offset compensation circuit 370 may comprise first switching group 372, second switching group 374, DAC block 386, DAC block 388, and offset correction loop 380. First switching group 372 may comprise first positive switch 372a and first negative switch 372b. First switching group 372 may selectively couple DAC block 386 to the inputs of amplification stage 330 and the first end of variable gain block 320. For example first positive switch 372a may couple DAC block 386 to positive input node 322a. First negative switch 372b may couple DAC block 386 to negative input node 322b. Input nodes 322a and 322b reside between amplification stage 330 and a first end of variable gain block 320.

Similarly, second switching group 374 may comprise second positive switch 374a and second negative switch 374b. Second switching group 374 may selectively couple DAC block 388 to the second end of variable gain block 320 and sense block 310. For instance, second positive switch 374a may couple DAC block 388 to first variable gain input 324a. Second negative switch 374b may couple DAC block 388 to second variable gain input 324b.

Offset correction loop 380 may comprise comparator 384, digital block 382, and ground reference 308. As shown in FIG. 3, comparator 384 may compare output signal 332 with a ground reference value to detect zero-crossings in output signal 332. Digital block 382 may include digital circuitry to program a voltage offset based on the zero-crossings detected by comparator 384.

As shown, variable gain block 320 may comprise first variable gain resistor 326a and second variable gain resistor 326b, each corresponding to a differential line of amplifier 300. Similarly, sense block 310 may comprise first sense resistor 312a and second sense resistor 312b, each corresponding to a differential line of amplifier 300.

Offset compensation circuit 370, sense block 310, and variable gain block 320 may perform a multi-point offset compensation. An exemplary multi-point compensation may begin with setting first variable gain resistor 326a and second variable gain resistor 326b to a minimum value.

An exemplary multi-point offset compensation may continue with correcting a first voltage offset between output 348 and a reference level. To correct the first voltage offset, comparator 384 may compare output signal 332 at output 348 to a ground reference value from ground reference 308. Performing calculations in the digital domain, digital block 382 may produce a first digital signal to compensate for a bias difference between output signal 332 and reference ground level 308 by making adjustments to input nodes 322a and 332b. DAC block 386 may convert the first digital signal to an analog voltage value that adjusts the bias voltage at nodes 322a and 322b. First positive switch 372a and first negative switch 372b may close to accommodate this adjustment.

A multi-point offset compensation may continue with modifying the gain of variable gain block 320. For example, first variable gain resistor 326a and second variable gain resistor 326b may be set to a minimum value after the first offset voltage correction. As a result, a new offset voltage may appear at output 348.

A multi-point offset compensation may further include correcting this second voltage offset between output 348 and ground reference level 308. To correct the second voltage offset, comparator 384 may compare output signal 332 at output 348 to a ground reference value from ground reference 308. Performing calculations in the digital domain, digital block 382 may produce a second digital signal to compensate for a bias difference between output signal 332 and ground reference level 308. As shown in FIG. 3, DAC block 388 may convert the second digital signal to an analog voltage value that adjusts the bias voltage at nodes 324a and 324b. Second positive switch 374a and second negative switch 374b may close to accommodate this adjustment. After this exemplary multi-point compensation, embodiments of the present invention may continue to reduce an ON/OFF transient in the exemplary audio amplifier.

Although the specific embodiment of offset compensation circuit 370 shown in FIG. 3 represents offset correction loop 380 as an integrated implementation serving both DAC blocks 386 and 388, in some embodiments, offset compensation circuit 370 may be implemented using a plurality of offset compensation circuits, each including a dedicated offset compensation loop and DAC block.

The embodiments of the present invention exemplified in FIGS. 1 through 3 will be further described by reference to flowchart 400 in FIG. 4. Flowchart 400 in FIG. 4 describes the steps, according to one embodiment of the present invention, of a method for substantially reducing an ON/OFF transient of an amplifier. It is noted that certain details and features that are apparent to a person of ordinary skill in the art have been left out of flowchart 400. For example, a step may comprise one or more substeps that are known in the art. While steps 410 through 450 indicated in flowchart 400 are sufficient to describe one embodiment of the present invention, other embodiments of the invention may utilize steps different from those shown in flowchart 400.

Step 410 of flowchart 400 comprises configuring a pre-driver to be in an ON state. Referring to FIG. 2, pre-driver 252 may be configured to remain in an ON state if amplification stage 230 is in an ON state. Alternatively, if amplification stage 230 is in an OFF state, main power source 242 may turn ON pre-driver 252. Ground connection switch 268 may also close to keep output 248 at a ground-referenced value during power ON or power OFF sequences.

Returning to flowchart 400 in FIG. 4, step 420 of flowchart 400 comprises activating a bypass circuit of the amplifier. Turning to FIG. 2, bypass circuit 256 may be activated by powering ON bypass circuit 256, including auxiliary output stage 256b, with auxiliary power source 246. Bypass feedback switch 262 may be closed to allow bypass feedback branch 264 to settle an initial ON/OFF transient, which can be much smaller than the ON/OFF transient of a conventional audio amplifier.

After bypass feedback branch 264 has settled the initial ON/OFF transient, auxiliary output switch 256a may be closed to couple bypass circuit 256 (and auxiliary output stage 256b) to output 248. Closing auxiliary output switch 256a does not typically create a significant ON/OFF transient because the presence of bypass feedback branch 264 allows embodiments of the present invention to have a very low output impedance.

Continuing with flowchart 400 in FIG. 4, step 430 of flowchart 400 comprises changing a power state of an output stage of the amplifier from a first state to a second state. Returning to FIG. 2, output stage 254 may change from a first state to a second state in two ways. On one hand, if the amplifier is initially OFF and is to be powered ON, a first state may comprise an OFF power state and a second state may comprise an ON power state. In such a case, step 430 of flowchart 400 may comprise powering ON output stage 254 by powering ON output power source 244.

On the other hand, if the amplifier is ON and is to be powered OFF, a first state may comprise an ON power state and a second state may comprise an OFF power state. In such an alternative case, step 430 of flowchart 400 may comprise powering OFF output stage 254 by powering OFF output power source 244.

Returning to flowchart 400 of FIG. 4, step 440 of flowchart 400 comprises deactivating the bypass circuit. Turning to FIG. 2, bypass circuit 256 may be deactivated. Deactivating bypass circuit 256 may comprise powering OFF bypass circuit 256 by powering OFF auxiliary output stage 256b with auxiliary power source 246. Deactivating bypass circuit 256 may also comprise opening auxiliary output switch 256a to decouple bypass circuit 256 (and auxiliary output stage 256b) from output 248. Additionally, deactivating bypass feedback circuit 256 may also comprise opening bypass feedback switch 262 as the initial ON/OFF transient may have settled at this time.

Turning to step 450 of flowchart 400 in FIG. 4, step 450 comprises changing the power state of the amplifier from a first state to a second state. The first and second states could correspond to the first and second states recited in the context of step 430 of flowchart 400. For example, if the amplifier is initially ON and is to be powered OFF, a first state may comprise an ON power state and a second state may comprise an OFF power state. In this case, step 450 of flowchart 400 may comprise adjusting the amplifier to an OFF power state. Moreover, ground connection switch 268 may be opened to disconnect output 248 from ground reference 206.

In one embodiment of the present method, step 450 may also include performing offset compensation, such as a multi-point offset compensation. More generally, it is noted that offset compensation, such as multi-point offset compensation, can occur at any of steps 410 through 450 represented in FIG. 4.

Embodiments of the present invention describe audio amplifiers that can be integrated into mobile devices such as cellular telephones without the drawbacks of conventional audio amplifiers. For example, embodiments of the present invention provide a gradual power transition sequence that includes a series of novel switching events and that reduces the ON/OFF transient when an audio amplifier is powered ON or OFF. Additionally, embodiments of the present invention are readily adaptable to ground referenced headset driver architectures and are compatible with many mobile devices, including cellular telephones.

In addition, the novel multi-point compensation circuitry of the present invention allow an audio amplifier to be directly coupled to communications circuitry, such as circuitry on a transceiver baseband chip, without costly passive components. The novel multi-point compensation circuitry of the present invention also enables reduction in amplifier offset, ON/OFF transients, and PCB cost.

From the above description of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An amplifier to reduce an ON/OFF transient, said amplifier comprising:
   a drive block comprising a pre-driver and an output stage; and
   a bypass circuit coupling an output of said pre-driver to a selectable bypass feedback branch;
   said bypass circuit selectively activated to reduce said ON/OFF transient;
   wherein said bypass circuit is activated independently of an activation of said selectable bypass feedback branch.

2. The amplifier of claim 1, wherein said bypass circuit is coupled between said output of said pre-driver and an output of said amplifier.

3. The amplifier of claim 1, wherein said selectable bypass feedback branch is coupled between said output of said pre-driver and an input of said drive block.

4. The amplifier of claim 1, wherein said ON/OFF transient comprises a pop/click audio interference corresponding to a transition of said amplifier from a first power state to a second power state.

5. The amplifier of claim 4, wherein said first power state comprises an ON state, and said second power state comprises an OFF state.

6. The amplifier of claim 1, wherein said bypass circuit comprises an auxiliary output stage and at least one switch.

7. The amplifier of claim 1, further comprising a ground connection switch operable to selectively couple an output of said amplifier to a ground reference.

8. The amplifier of claim 1, wherein said amplifier is configured as an audio amplifier.

9. The amplifier of claim 1, further comprising an offset compensation circuit to compensate for a bias voltage difference between said amplifier and a reference level.

10. The amplifier of claim 9, wherein said offset compensation circuit is configured to provide a multi-point offset compensation.

11. The amplifier of claim 9, further comprising a variable gain circuit, wherein said offset compensation circuit is coupled to an input of said amplifier and to an input of said variable gain circuit.

12. The amplifier of claim 11, wherein said offset compensation circuit comprises:
   a first offset compensation circuit coupled to an output of said amplifier and a first end of said variable gain circuit, said first end coupled to an input of an amplification stage of said amplifier;
   a second offset compensation circuit coupled to said output of said amplifier and a second end of said variable gain circuit;
   at least one of said first offset compensation circuit and said second offset compensation circuit including an offset correction loop and a digital-to-analog converter (DAC).

13. A method for reducing an ON/OFF transient of an amplifier, said method comprising:
   activating a bypass circuit of said amplifier, when a pre-driver of said amplifier is in an ON state, wherein said bypass circuit couples said pre-driver to a selectable bypass feedback branch and is activated independently of an activation of said selectable bypass feedback branch;
   changing a power state of an output stage of said amplifier from a first state to a second state; and
   deactivating said bypass circuit.

14. The method of claim 13, wherein said bypass circuit is coupled between an output of said pre-driver and an output of said amplifier.

15. The method of claim 14, wherein activating said bypass circuit comprises:
   powering ON said bypass circuit; and
   coupling said bypass circuit to said output of said amplifier.

16. The method of claim 14, wherein deactivating said bypass circuit comprises:
   decoupling said bypass circuit from said output of said amplifier; and
   powering OFF said bypass circuit.

17. The method of claim 13, wherein said selectable bypass feedback branch is coupled between an output of said pre-driver and an input of an amplifier drive block including said pre-driver.

18. The method of claim 13, further comprising configuring said pre-driver to be in an ON state.

19. The method of claim 13, further comprising performing a multi-point offset compensation.

20. The method of claim 19, wherein performing said Multi-point offset compensation comprises:
   correcting a first voltage offset between an output of said amplifier output and a reference level;
   modifying the gain of a variable gain circuit coupled to an input of said amplifier; and
   correcting a second voltage offset between said output of said amplifier and said reference level.

* * * * *